United States Patent [19]

Song

[11] Patent Number: 5,942,450

[45] Date of Patent: Aug. 24, 1999

[54] METHOD OF FABRICATING SEMICONDUCTOR DEVICE

[75] Inventor: Du-Heon Song, Kyungki-do, Rep. of Korea

[73] Assignee: LG Semicon Co., Ltd., Chungcheongbuk-Do, Rep. of Korea

[21] Appl. No.: 08/990,148

[22] Filed: Dec. 12, 1997

[30] Foreign Application Priority Data

Apr. 25, 1997 [KR] Rep. of Korea ............... 1997/15703

[51] Int. Cl.⁶ ...................................................... H01L 21/00
[52] U.S. Cl. ........................... 438/747; 438/756; 438/757
[58] Field of Search ............................ 438/303, 756, 438/757, 745

[56] References Cited

U.S. PATENT DOCUMENTS

| 4,356,623 | 11/1982 | Hunter | 29/571 |
|---|---|---|---|
| 4,645,563 | 2/1987 | Terada | 156/643 |
| 4,689,869 | 9/1987 | Jambotkar et al. | 437/44 |
| 4,728,621 | 3/1988 | Graf et al. | 437/41 |
| 5,342,797 | 8/1994 | Sapp et al. | 437/41 |

*Primary Examiner*—Benjamin Utech
*Assistant Examiner*—Vanessa Pérez-Ramas
*Attorney, Agent, or Firm*—Morgan, Lewis & Bockius LLP

[57] ABSTRACT

A method of fabricating a semiconductor device includes the steps of sequentially forming a gate oxide layer, a gate material layer and a cap insulating layer on a semiconductor substrate, selectively etching them to form a gate, sequentially forming a plurality of material layers on the overall surface of the semiconductor substrate including the gate, etching them back to form a gate sidewall spacer out of the plurality of material layers, and selectively removing the plurality of material layers forming the gate sidewall spacer to form gate sidewall spacers having lengths different from each other, the lengths depending on a particular region of the substrate.

10 Claims, 3 Drawing Sheets

METHOD OF FABRICATING SEMICONDUCTOR DEVICE

This application claims the benefit of Korean Patent Application No. 15703/1997, filed on Apr. 25, 1997, which is hereby incorporated by reference.

BACKGROUND OF THE INVENTION

1. Field of the Invention

The present invention relates to a semiconductor device, and more particularly, to a method of fabricating a semiconductor device including selectively forming a gate sidewall spacer.

2. Discussion of the Related Art

In a conventional semiconductor memory device such as a DRAM (Dynamic Random Access Memory), gate sidewall spacers are simultaneously formed in a cell region and a periphery circuit region, using the same process even though these regions require the gate sidewall spacers having characteristics different from each other. As memory devices become more highly integrated, the space between gates in the cell region becomes narrower, requiring a decrease in a length of the gate sidewall spacer. The reduction of the gate length does not affect the cell region, but makes the fabrication of an LDD-structure (Lightly Doped Drain) transistor difficult on the periphery circuit region.

A conventional method of fabricating a semiconductor device will be explained below with reference to the accompanying drawings. FIGS. 1A and 1B are cross-sectional views showing the conventional method of fabricating a semiconductor device. In the conventional fabrication process, the gate sidewall spacer is formed in order to protect the gate and to form an impurity diffusion region of the LDD structure under the gate.

Referring to FIG. 1A, a gate oxide layer 2 is formed on a semiconductor substrate 1, and a gate material layer 3 is formed thereon, using, for example, polysilicon. A cap insulating layer 4 is formed on the gate material layer 3. The cap insulating layer 4, the gate material layer 3, and the gate oxide layer 2 are selectively etched to form a gate electrode.

Referring to FIG. 1B, a material layer for a sidewall spacer is formed on the overall surface of semiconductor substrate 1 (including a cell region and a periphery circuit region) on which the gate electrode is formed, and then etched back, forming sidewall spacers on both sides of the gate electrode. Thereafter, impurity ion implantation is carried out to form a source/drain region using the gate electrode as a mask (not shown).

According to the conventional fabrication process, since the sidewall spacer is simultaneously formed on the cell region and the periphery circuit region, it cannot satisfy the different requirements of the two regions. For a memory device like a DRAM, the sidewall spacer is formed in the periphery circuit region and the cell region under the same process conditions. The sidewall spacer in the cell region is fabricated not to form the LDD structure, but to obtain some margin in such process steps as bit line contact formation and node contact formation.

Furthermore, the process steps performed on the cell region become much more important as the device becomes more highly integrated. Thus, process parameters for the sidewall spacer formation are determined with regard to the overall process margin in the cell region. Accordingly, the periphery circuit region cannot have the sidewall spacer with optimal characteristics.

The cell region and the periphery circuit region require sidewall spacers with sizes and thicknesses different from each other. However, the conventional fabrication method cannot provide the sidewall spacers satisfying the requirements of each region. Since the sidewall spacers are formed in all regions under the conditions satisfying the requirements of only one region, the other regions cannot have a transistor which meets their requirements.

SUMMARY OF THE INVENTION

Accordingly, the present invention is directed to a method of fabricating a semiconductor device that substantially obviates one or more of the problems due to limitations and disadvantages of the related art.

An object of the present invention is to provide a method of fabricating a semiconductor device which forms gate sidewall spacers under different process conditions for regions having different requirements, in order to form the gate sidewall spacer satisfying the requirements of different regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a semiconductor device according to the present invention includes the steps of forming a gate oxide layer on a substrate, forming a gate material layer on the gate oxide layer, forming a cap insulating layer on the gate material layer, patterning the gate oxide layer, the gate material layer, and the cap insulating layer to form a gate, forming a plurality of spacer material layers on the substrate, the cap insulating layer and the gate, patterning the plurality of spacer material layers to form gate sidewall spacers, and selectively removing at least some of the plurality of spacer material layers to form gate sidewall spacers having different lengths.

In another aspect, a method of fabricating a semiconductor device includes the steps of forming a gate oxide layer on a substrate, forming a gate material layer on the gate oxide layer, forming a cap insulating layer on the gate material layer, patterning the gate oxide layer, the gate material layer, and the cap insulating layer to form a gate, forming a first spacer material layer on the substrate, the gate, and the insulating layer, patterning the first spacer material layer to form a first gate sidewall spacer, performing ion implantation on a selected region using the first gate sidewall spacer as a mask, removing the first gate sidewall spacer, forming a second material layer on the substrate, the gate, the cap and etching the second material layer to form a second gate sidewall spacer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF THE PREFERRED EMBODIMENTS

Reference will now be made in detail to the preferred embodiments of the present invention, examples of which are illustrated in the accompanying drawings.

FIGS. 2A–2D are cross-sectional views showing a method of fabricating a semiconductor device according to a first embodiment of the present invention. The fabrication method of the present invention forms a double sidewall spacer using a plurality of material layers having different etching rates, and the plurality of material layers are selectively removed so that a remainder is left on different regions as required for each region, thereby forming gate sidewall spacers which satisfy the requirements of each region.

Figure 1A:
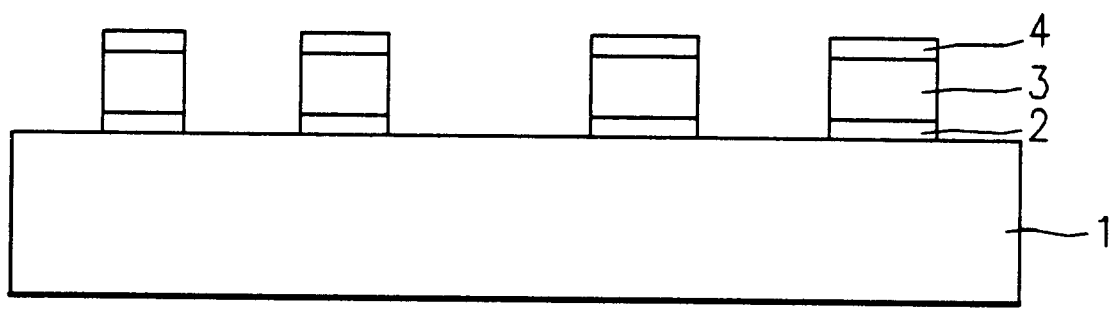
FIGS. 1A–1B are cross-sectional views showing a conventional method of fabricating a semiconductor device.
Figure 1B:
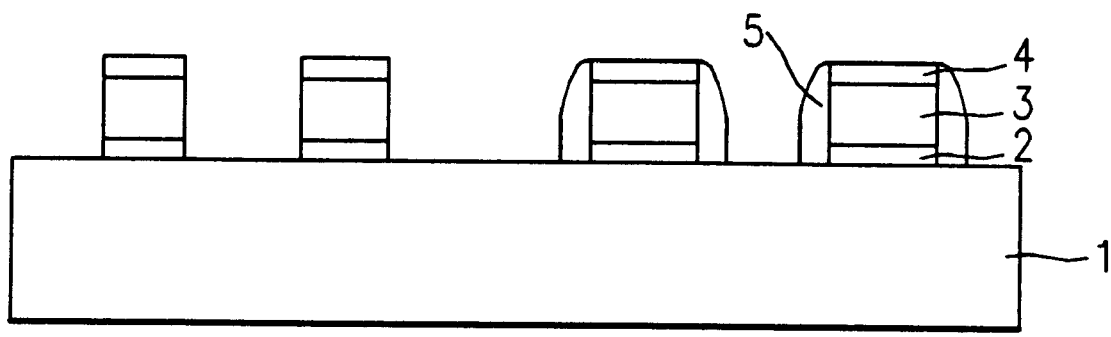
Figure 2A:
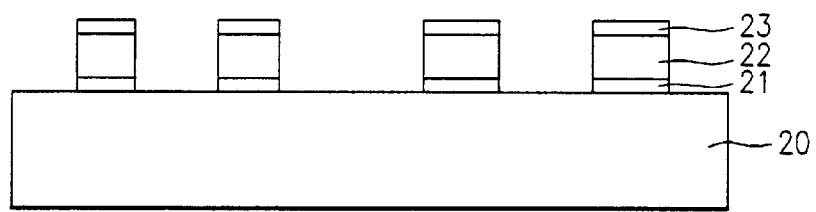
FIGS. 2A–2D are cross-sectional views showing a method of fabricating a semiconductor device according to a first embodiment of the present invention.

Referring to FIG. 2A, a gate oxide layer 21, a gate material layer 22 and a cap insulating layer 23 are sequentially formed on a semiconductor substrate 20 including various regions, such as a cell region and a periphery circuit region. The different regions require transistors having different characteristics. Then, the gate oxide layer 21, the gate material layer 22 and the cap insulating layer 23 are etched to form a gate 22.

Figure 2B:
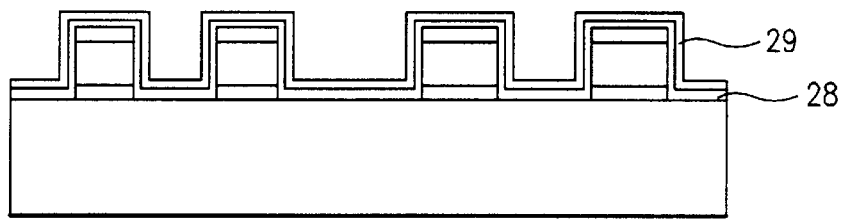
Figure 2C:
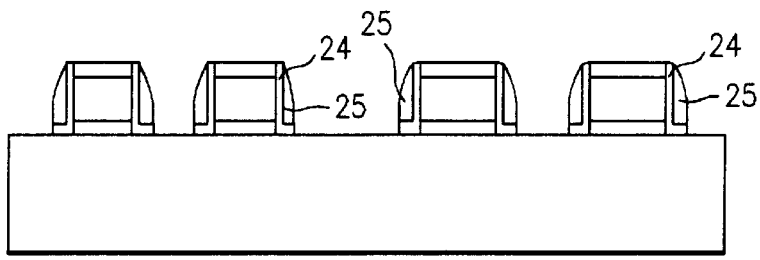

Referring to FIG. 2B, first and second material layers 28 and 29 having different etching rates are sequentially formed on the surface of semiconductor substrate 20 including the gate 22. The first material layer 28 may be formed of an undoped CVD oxide layer or a thermal oxide layer, and the second material layer 28 may be formed of a doped CVD oxide layer. Thereafter, the first and second material layers 28 and 29 are etched back to form first and second gate sidewall spacers 24 and 25 as shown in FIG. 2C.

Figure 2D:
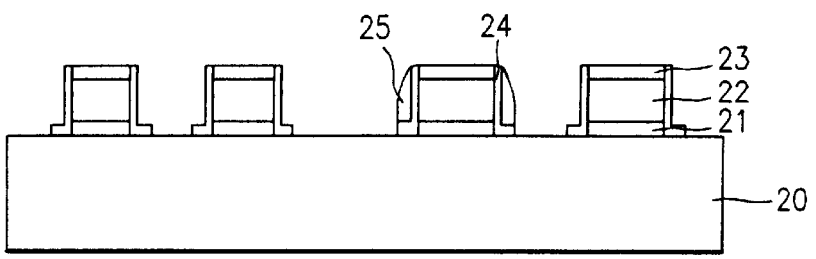

Referring to FIG. 2D, first and second gate sidewall spacers 24 and 25 are left as they are, or only the second gate sidewall spacer 25 is selectively removed, to meet the requirements of the corresponding regions. A photoresist layer is formed on a portion which requires wider sidewall length. A portion of the sidewall spacer without the photoresist layer is removed through wet etching using HF in a vapor form. Here, a field oxide layer (not shown) is used as an isolation layer as well, so that the substrate 20 is not damaged during the wet etching process, because the ratio of the etching rate of the first and second gate sidewall spacers 24 and 25 to the etching rate of the oxide layer is about 200:1.

In the selective gate sidewall spacer formation method described above, the length of the sidewall spacer does not depend on the regions, such as the cell region or the periphery circuit region, but depends on different requirements for devices, such as NMOS and PMOS transistors. That is, it is possible to select the length of each gate sidewall spacer of the NMOS and PMOS devices by using diffusivity of ions which are implanted to form the NMOS and PMOS devices.

A method of fabricating a semiconductor device according to a second embodiment of the present invention will be explained below with reference to FIGS. 3A–3D. This method forms the LDD structure in such a manner that a gate sidewall spacer is formed first to satisfy the requirements of a particular region (generally a periphery circuit region), thereby forming an LDD-structure transistor. Then, the gate sidewall spacer is removed, and another gate sidewall spacer is formed, in order to meet the requirements of the cell region, and in order to protect the gate and to allow self-alignment to occur during bit line contact formation and node contact formation.

Figure 3A:
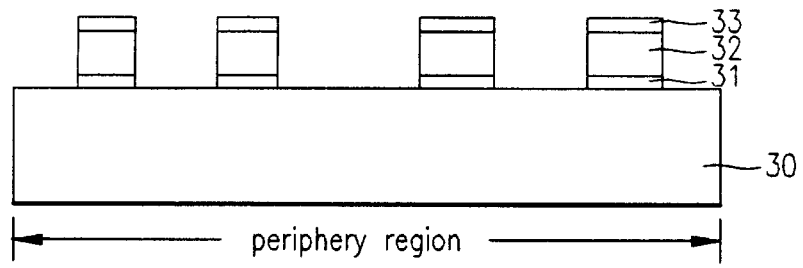
FIGS. 3A–3D are cross-sectional views showing a method of fabricating a semiconductor device according to a second embodiment of the present invention.

Referring to FIG. 3A, a gate oxide layer 31, a gate material layer 32 and a cap insulating layer 33 are sequentially formed on a semiconductor substrate 30 including various regions, such as the cell region and the periphery circuit region, which require their transistors to have different characteristics. Then the gate oxide layer 31, the gate material layer 32 and the cap insulating layer 33 are etched to form a gate 32.

Figure 3B:
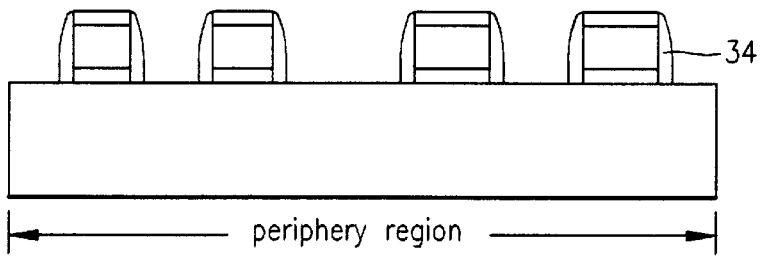

Referring to FIG. 3B, a first material layer for forming a gate sidewall spacer and defining its length is formed on the surface of semiconductor substrate 20 including the gate 22, having only the characteristics needed for the periphery circuit region. The first material layer may be formed of an undoped CVD (chemical vapor deposition) oxide layer. Then, a first gate sidewall spacer 34 is formed by etching-back the first material layer. The first gate sidewall spacer 34 is formed as a buffer, having only the characteristics needed for the periphery circuit region. The first gate sidewall spacer 34 is to be removed after the transistor of the periphery circuit region is formed, and then a gate sidewall spacer 35 for the cell region is to be formed.

Figure 3C:
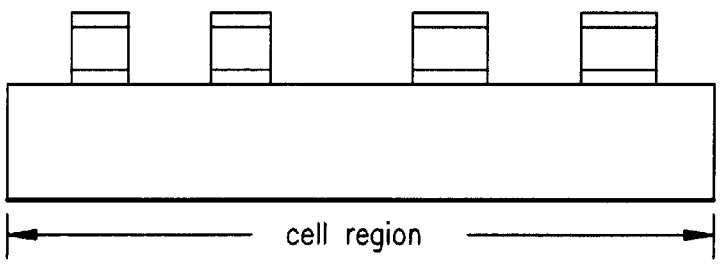

Referring to FIG. 3C, the first gate sidewall spacer 34 is removed through a wet etching process using HF in a vapor form. A field oxide layer (not shown) is used as an isolation layer as well, so that the substrate 30 is not damaged during the wet etching process, because the ratio of the etching rate of the first material layer of the sidewall spacer 34 to the etching rate of the gate oxide layer 31 and the field oxide layer is about 200:1.

Figure 3D:
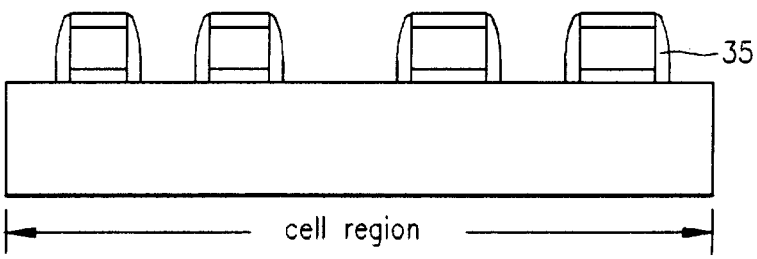

Referring to FIG. 3D, a second material layer is formed on the surface of substrate 30 including the gate 32, in order to form a gate sidewall spacer 35 satisfying the requirements of the cell region. The second material layer is then etched back, forming a second gate sidewall spacer 35. In this fabrication method, the gate sidewall spacer 34 for the periphery circuit region is formed first, and the process is carried out up to ion implantation that forms the source/drain. Thereafter, the first gate sidewall spacer 34 is removed, and the second gate sidewall spacer 35 of the cell region is formed.

The present invention has the following advantages. First, the gate sidewall spacer in the first embodiment is formed by selectively etching a plurality of material layers having different etching rates in order to satisfy different requirements in different regions. This improves the performance of the semiconductor device.

Furthermore, in the second embodiment, the gate sidewall spacer satisfying the requirements of the periphery circuit region is formed first, then ion implantation is carried out to form the source/drain regions. The gate sidewall spacer of the periphery circuit region is removed, and then the gate sidewall spacer satisfying the requirements of the cell region is formed. In other words, the gate sidewall spacer in the periphery circuit region whose characteristics are changed by the ion implantation is removed, and another gate sidewall spacer is formed in the cell region. Accordingly, it is possible to obtain the gate sidewall spacers which meet the requirements of each region. This prevents the device reliability from degrading due to the deterioration of the gate sidewall spacer. Moreover, this maintains adequate fabrication tolerances because the gate sidewall spacers satisfy the requirements of each particular region.

It will be apparent to those skilled in the art that various modifications and variations can be made in the method of fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device comprising the steps of:

forming a gate oxide layer on a substrate;

forming a gate material layer on the gate oxide layer;

forming a cap insulating layer on the gate material layer;

selectively etching the gate oxide layer, the gate material layer, and the cap insulating layer to form a gate;

forming a plurality of spacer material layers on the substrate and the gate;

patterning the plurality of spacer material layers to form gate sidewall spacers; and selectively removing at least some of the plurality of spacer material layers to form gate sidewall spacers having different lengths.

2. The method as claimed in claim 1, wherein the step of selectively removing the at least some of the plurality of spacer material layers includes forming a photoresist layer on a portion of the substrate requiring a longer gate sidewall spacer length.

3. The method as claimed in claim 1, wherein the step of selectively removing the at least some of the plurality of spacer material layers includes wet etching with HF in a vapor form.

4. The method as claimed in claim 1, wherein the step of forming a plurality of spacer material layers includes forming material layers with at least a 200:1 difference in etch rates compared to an oxide material.

5. The method as claimed in claim 1, wherein the step of forming a plurality of spacer material layers includes the steps of:

forming a first spacer material layer comprising an undoped oxide layer; and forming a second spacer material layer on the first spacer material layer comprising a doped oxide layer.

6. The method as claimed in claim 1, wherein the step of forming a plurality of spacer material layers includes the steps of:

forming a first spacer material layer comprising a thermal oxide layer; and forming a second spacer material layer on the first spacer material layer comprising a doped oxide layer.

7. A method of fabricating a semiconductor device comprising the steps of:

forming a gate oxide layer on a substrate;

forming a gate material layer on the gate oxide layer;

forming a cap insulating layer on the gate material layer;

patterning the gate oxide layer, the gate material layer, and the cap insulating layer to form a gate;

forming a first spacer material layer on the substrate and the gate;

patterning the first spacer material layer to form a first gate sidewall spacer;

performing ion implantation on a selected region using the first gate sidewall spacer as a mask;

removing the first gate sidewall spacer;

forming a second material layer on the substrate and the gate, and etching the second material layer to form a second gate sidewall spacer.

8. The method as claimed in claim 7, wherein the step of removing the first gate sidewall spacer includes wet etching with HF in a vapor form.

9. The method as claimed in claim 7, wherein the first spacer material layer is formed of a material having an etching rate of at least 200:1 to an etching rate of the gate oxide layer.

10. The method as claimed in claim 7, wherein the first spacer material layer is formed of a doped oxide layer.

* * * * *